(12) United States Patent
Walck et al.

(10) Patent No.: US 7,759,656 B1
(45) Date of Patent: Jul. 20, 2010

(54) DUAL AIR PARTICLE SAMPLE CASSETTE AND METHODS FOR USING SAME

(75) Inventors: Scott D. Walck, Oceanside, CA (US); David J. Henriks, San Clemente, CA (US)

(73) Assignee: South Bay Technology, Inc., San Clemente, CA (US)

(*) Notice: Subject to any disclaimer, the term of this patent is extended or adjusted under 35 U.S.C. 154(b) by 186 days.

(21) Appl. No.: 11/712,830

(22) Filed: Feb. 28, 2007

Related U.S. Application Data

(60) Provisional application No. 60/778,237, filed on Mar. 1, 2006.

(51) Int. Cl.
*G21K 5/08* (2006.01)
*H01J 37/20* (2006.01)

(52) U.S. Cl. .......................... 250/440.11; 250/441.11; 250/442.11

(58) Field of Classification Search ............ 250/440.11, 250/306, 307, 309, 310, 311, 441.11, 442.11, 250/443.1
See application file for complete search history.

(56) References Cited

U.S. PATENT DOCUMENTS

| | | | |
|---|---|---|---|
| 5,367,171 A | 11/1994 | Aoyama et al. | |
| 5,530,253 A * | 6/1996 | Nishioka et al. | 250/442.11 |
| 5,753,924 A * | 5/1998 | Swann | 250/443.1 |
| 5,923,040 A * | 7/1999 | Carroll | 250/440.11 |
| 6,300,631 B1 * | 10/2001 | Shofner | 250/311 |
| 6,394,409 B1 * | 5/2002 | Chen et al. | 248/694 |
| 6,479,830 B1 | 11/2002 | Fornaca et al. | |
| 6,576,910 B2 | 6/2003 | Hashikawa et al. | |
| 6,777,674 B2 | 8/2004 | Moore et al. | |
| 6,967,335 B1 | 11/2005 | Dyer et al. | |
| 7,112,790 B1 | 9/2006 | Wang | |
| 7,115,882 B2 | 10/2006 | Moore | |
| 7,126,132 B2 | 10/2006 | Moore | |
| 7,394,075 B1 * | 7/2008 | Wang | 250/440.11 |
| 2004/0251412 A1 * | 12/2004 | Tappel | 250/304 |
| 2006/0169923 A1 * | 8/2006 | Yamashita | 250/492.21 |
| 2008/0236255 A1 * | 10/2008 | Martinoty et al. | 73/54.38 |

FOREIGN PATENT DOCUMENTS

| | | | |
|---|---|---|---|
| JP | 03-197837 | * | 8/1991 |
| WO | WO 2006018516 | * | 2/2006 |

OTHER PUBLICATIONS

Tsung, Anciso, Davidson, Turner, Alqaq, and Skloss; FIB/TEM Sample Preparation Using a Wafer Dicing Saw; 2000.

* cited by examiner

*Primary Examiner*—Jack I Berman
*Assistant Examiner*—Nicole Ippolito Rausch
(74) *Attorney, Agent, or Firm*—Stout, Uxa, Buyan & Mullins, LLP; Donald E. Stout

(57) ABSTRACT

An assembly for holding a microscopy sample for storage, observation, manipulation, characterization and/or study of the sample using a microscopy instrument is provided. The assembly includes mating first and second parts having faces between which a microscopy sample, including a TEM grid mounted sample, is secured. A spring is used to provide compression between the faces. A rotatable member such as a threaded screw is operable to draw the parts apart from one another. An annular wall functions to protect microscopy samples held in the assembly from damage.

20 Claims, 7 Drawing Sheets

DUAL AIR PARTICLE SAMPLE CASSETTE AND METHODS FOR USING SAME

The present application claims priority to U.S. Provisional Patent Application No. 60/778,237, filed on Mar. 1, 2006, the entire disclosure of which is incorporated herein by this reference.

The present invention generally relates to assemblies for holding material specimens, and more specifically relates to assemblies for holding, but not limited to, transmission electron microscope (TEM), scanning electron microscope (SEM), and focused ion beam (FIB) atomic force microscope (AFM), field ion microscope (FIM), atom probe (AP) samples, and other types of for observation, processing and/or storage.

BACKGROUND

Much development is being achieved on the micrometer (μm) and nanometer (nm) size scales in the fields of biology, medicine, physics, chemistry, electronics, engineering, and nanotechnology to, for example, study objects (e.g., materials, organisms, viruses, bacteria, etc.), create new objects, and/or assemble objects together with great precision.

To perform manipulation of objects on such a small size scale, it is often necessary to use microscope equipment to aid in observing the objects. For instance, the smallest object that human beings can see with the unaided eye is about 0.1 millimeter (mm). With a good light microscope (also referred to as an "optical microscope"), an image may be magnified up to about 1500 times. However, magnification achievable with light microscopes is limited by the physics of light (i.e., the wavelength of light) upon which the operation of such microscopes is based. For example, light microscopes have relatively limited resolving power (ability to distinguish clearly between two points very close together) and the best resolving power that can be achieved with a light microscope is around 0.2 μm. Points closer together than this cannot be distinguished clearly as separate points using a light microscope.

Electron microscopes have been developed that use a beam of electrons, rather than light, to study objects too small to study with conventional light microscopes.

Modern electron microscopes can view detail at the atomic level with sub-nanometer resolution (e.g., less than 0.1 nm resolution) at up to a million times magnification.

Various different types of electron microscopes have been developed. One type of electron microscope is the transmission electron microscope (TEM). In a TEM, electrons are transmitted through a thinly sliced specimen to be observed and typically form a viewable image on a fluorescent screen or photographic plate. Areas of the specimen having relatively higher density generally appear darker in the resulting image. TEMs can magnify, an object under observation up to one million times and are used extensively, in the fields of biology and medicine for example, to study structures of viruses and plant and animal cells.

Another type of electron microscope is the scanning electron microscope (SEM). In an SEM, the beam of electrons is focused to a point and scanned over the surface of the specimen. Detectors collect the backscattered and secondary electrons coming from the surface and convert them into a signal that in turn is used to produce a highly realistic, three-dimensional image of the specimen. SEMs generally require the observed specimen to be electrically conductive. Specimens that are not conductive are typically coated (e.g., using a sputter coater) with a thin layer of metal (often gold) prior to scanning. SEMs can magnify up to around one hundred thousand times or more.

Another type of microscope is the focused ion beam (FIB). The FIB is now commonly used for the preparation of specimens for later analysis using a transmission electron microscope (TEM).

The focused Ion Beam (FIB) system uses a gallium ion beam to raster over the surface of a sample in a similar way as the electrons beam in a SEM. The generated secondary electrons (or ions) are collected to form an image of the surface of the sample.

Unlike SEM, the FIB is inherently destructive to the sample. When the FIB gallium ions strike the sample, they cause atoms on the surface of the sample to sputter. Thus, the FIB is commonly used as a micromachining tool, to modify or machine materials on the microscale and nanoscale. For example, the FIB is often used in the semiconductor industry to patch or modify existing semiconductor devices. The FIB is also commonly used to prepare material samples for observation with a TEM, which requires very thin samples, i.e. samples of less than about 100 nanometers in thickness.

Structural evaluation using an electron microscope, such as a SEM or a TEM, has been conventionally employed as one of methods for examining and evaluating semiconductor devices and other engineering materials.

The failure analysis of semiconductor devices now routinely requires resolution requirements that only a TEM can achieve from samples prepared with an FIB instrument. Procedures have been developed for obtaining samples cut from a semiconductor device. Typically, a sample is from an original wafer or bulk material, prepared with the FIB, mounted to a substrate, for example a TEM grid using micromanipulation techniques, and sometimes further processed using the FIB. Specially designed TEM grids are commercially available from Omniprobe, Inc., Dallas, Tex., and other sources. TEM grids are typically made of copper, but other TEM grid materials include molybdenum, aluminum, nickel, and beryllium.

The preparation of samples using an FIB involves considerable cost because of the time of preparation and the high capital expense of the processing instruments. Further, TEM grid mounted samples are prone to breakage and damage due to the delicate structures of the materials mounted on the grid, as well as the fragile structure of the grid itself. Holders, for example, TEM grid boxes, have been developed for holding TEM grid-mounted samples, but none have proven to be adequate in protecting the samples from breakage, damage or loss, for example, during handling or during transportation. The TEM grids themselves are usually very thin, typically on the order of 25-30 μm. Even very minor flexing of the grid can endanger the sample mounted thereto. Membrane boxes are available which are designed to support a TEM grid mounted sample between two thin, flexible sheets of polymer. However, these membrane boxes have been known to cause damage to samples.

There is a continuing need for more effective assemblies for holding, storing and/or protecting microscopy samples.

SUMMARY OF THE INVENTION

Accordingly, the present invention provides assemblies for holding samples for example, transmission electron microscope (TEM), scanning electron microscope (SEM), and focused ion beam (FIB) samples.

In a broad aspect of the invention, an assembly is provided which generally comprises a first part having a first holding portion and a second part in engagement with the first part and having a second holding portion substantially facing the first holding portion, and a resilient member positioned to provide a compressive force between the first part and the second part. The compressive force is sufficient to secure a material sample located between the first holding portion and the second holding portion, preferably without causing damage to the sample. The assembly further comprises a mounting element operable to secure the first part and the second part to an instrument or device, for example a microscopy instrument, such as a FIB, or a sample storage/transport container. The assembly may further comprise one or more alignment elements for ensuring proper alignment of the parts.

In a specific embodiment of the invention, the resilient member at least partially circumscribes the first and second parts and holds the parts in engagement with each other. The resilient member may comprise an elastomeric member, such as an elastomeric band, for example, an elastomeric O-ring. Alternatively, the resilient member may comprise a spring, for example a coiled spring at least partially circumscribing the first and second parts. A groove or other suitable structure may be provided for maintaining positioning of the resilient member with respect to the parts, and maintaining the parts in registry with one another.

In another broad aspect of the invention, an assembly is provided which is structured to hold a TEM grid mounted sample. In a related embodiment, an assembly is provided for holding a variety of different types of microscopy samples, including, but not limited to TEM grid mounted samples. For example, in some embodiments, the assembly generally comprises a first part having a first holding portion and a second part having a second holding portion, the first and second holding portions configured for receiving and securing both a TEM grid mounted sample as well as a sample that is not mounted to a TEM grid, for example, a diced sample. When received in the recessed region and secured therein, the sample projects about a surface of the first part and can be accessed for observation and/or processing, for example, FIB processing.

In some embodiments, the first holding portion may include a recessed region having a radius of curvature which matches a radius of a TEM grid.

In other embodiments, the recessed region may alternatively or additionally include structure, such as a shelf region capable of accommodating a microscopy sample in a substantially upright position for observation, characterization or processing with a microscopy instrument. More specifically, the shelf regions may comprise spaced apart opposing shelves, for example, opposing shelves machined into the recessed region of the first part, the shelves being structured to accommodate opposing edge portions of a microscopy sample when the sample is clamped or compressed between the first part and second part.

In other embodiments, the first and second parts are structured to hold the sample in a position other than an upright position. For example, in some embodiments, the assembly is structured to hold a sample such that a major plane of the sample is substantially flush with a surface of the first and second parts. For example, the first and second parts may define a recessed region having a configuration that substantially matches the contours of a particular sample. For example, the recessed region may be circular, rectangular or have another suitable configuration. In these embodiments, the recessed region may have a depth at least as great as the thickness of the material sample to be held by the assembly.

In other embodiments, at least one of the first and second holding portions comprises a cut-out or groove, for example, a V-shaped groove, configured for holding material samples having a strand shape.

In another aspect of the invention, the assembly further comprises a mechanism operable to control separation, and therefore, opening, of the first and second surfaces. The mechanism may comprise a rotatable mechanism, for example a threaded screw, or a non-rotatable mechanism, for example a push rod.

In a particularly advantageous aspect of the present invention, the assembly may be structured to provide protection, for example, impact protection, to material samples held in the assembly. For example, the assembly may comprise first and second parts between which a sample can be secured in a substantially upright position, such as the first and second parts as described elsewhere herein, and may further comprise a projecting region, for example an upwardly extending flange at least partially circumscribing the sample held in the assembly. For example, the projecting region may be defined by a projecting wall which partially or fully circumscribes the first and second holding portions. In some embodiments, the projecting region comprises an annular-shaped projecting region.

In another broad aspect of the invention, an assembly for holding microscopy samples comprises a sample holder including a first part and a second part cooperatively engaged with the first part, a mechanism for providing compression between the first part and the second part in order to secure a material sample positioned therebetween, a mounting element operable to secure the sample holder to a microscopy instrument, and a base member removably couplable to the mounting element. The base member provides a convenient means for holding the sample holder when the sample holder and sample secured thereto are being stored or otherwise not coupled to a microscopy instrument. In some embodiments, the base member is advantageously structured so as to maintain a eucentric position of a sample held in the assembly. With this embodiment, it is possible to observe a sample, for example, by using a stereoscope, at two different angular positions, without the need to refocus the stereoscope. This embodiment of the invention is especially advantageous to facilitate proper loading of a sample, as well as to facilitate confirmation that the sample is correctly placed in the holder prior to further, more detailed observation or processing with a TEM and/or FIB.

These and other aspects and advantages of the present invention may be more clearly understood and appreciated with reference to the following detailed description, when considered in conjunction with the accompanying drawings in which like parts bear like reference numerals.

DETAILED DESCRIPTION OF THE INVENTION

Figure 1A:
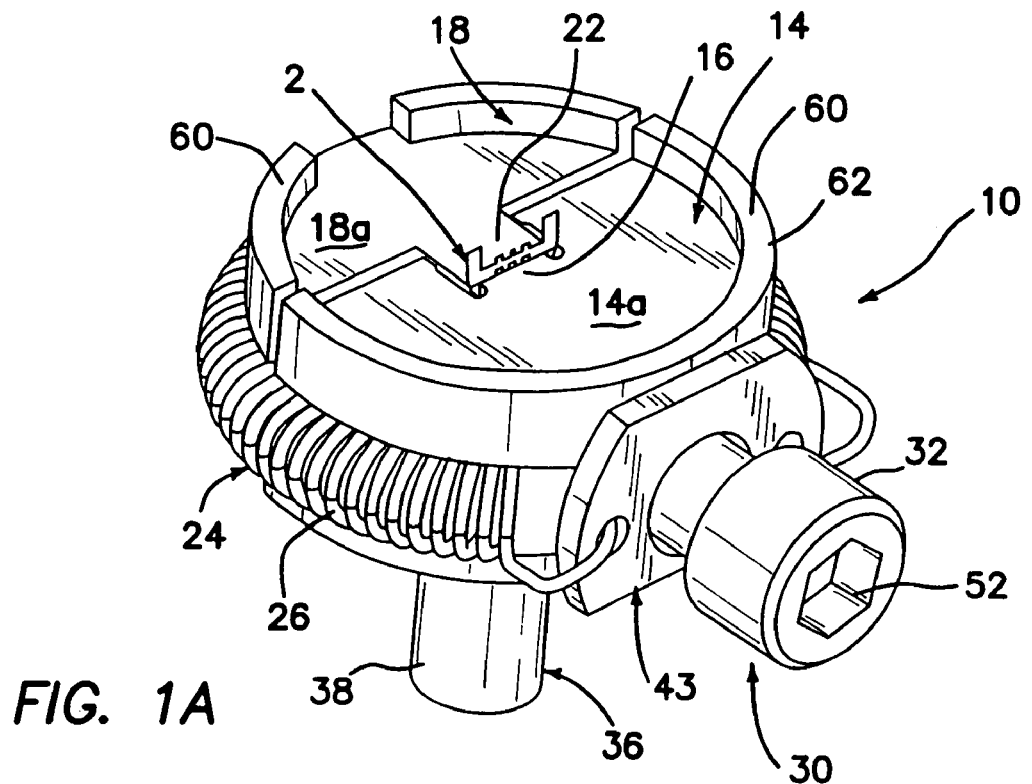
FIG. 1A is a perspective view of an assembly in accordance with the invention, the assembly being used to hold a microscopy sample held by a TEM grid.
Figure 1B:
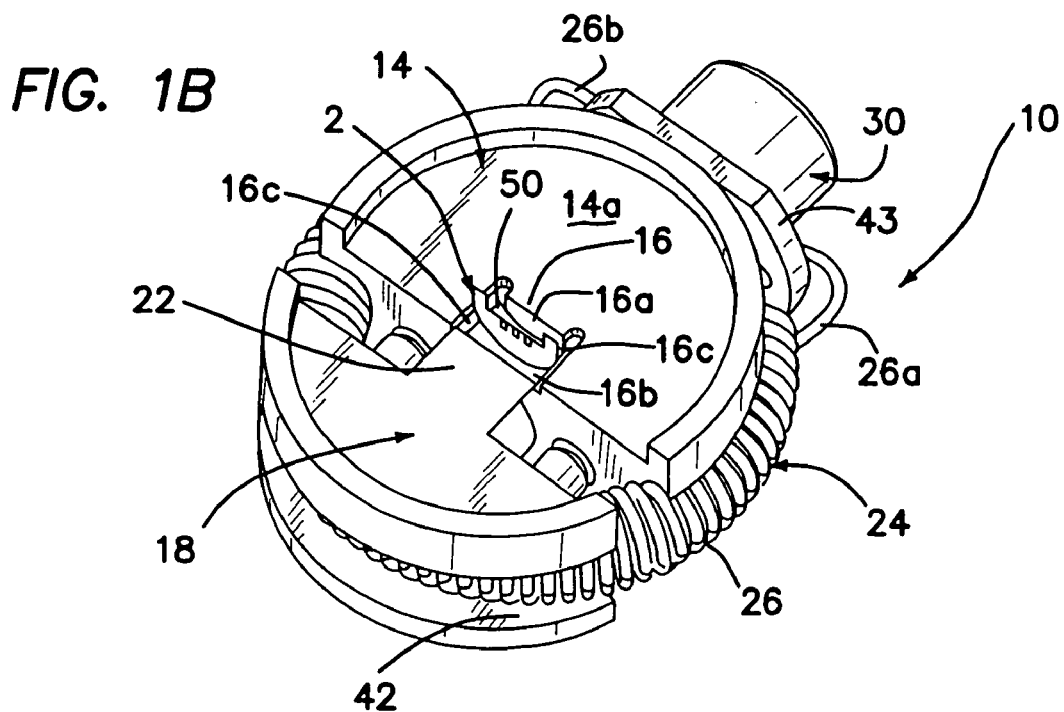
FIG. 1B is another perspective view of the assembly in accordance with the invention, showing the sample being removed from or placed into the assembly.
Figure 2:
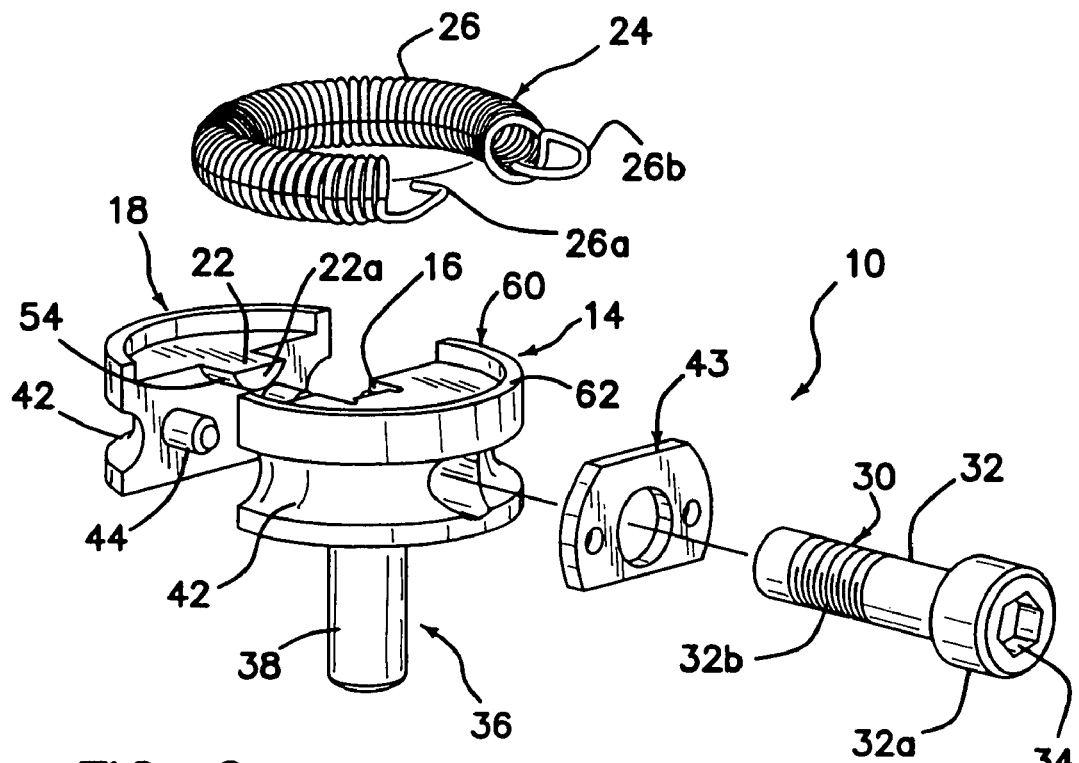
FIG. 2 is an exploded perspective view of the assembly shown in FIGS. 1A and 1B.

Turning to FIGS. 1A, 1B and 2, an assembly, in accordance with the invention, for holding transmission electron microscope (TEM), scanning electron microscope (SEM), and focused ion beam (FIB) samples is generally shown at 10.

The assembly 10 can be used to hold a sample, specifically a microscopy sample 2, for storage, observation, manipulation, characterization and/or study of the sample, for example, when the assembly 10 is positioned in a microscopy instrument. The assembly 10 is capable of safely securing such samples in a desired orientation preferably without the use of adhesives, adhesive pads, or conductive paint. Advantageously, in the embodiment shown, the assembly 10 is structured to be useful for securing two or more different types of microscopy samples, including, but not limited to, whole or cut samples, fiber samples, TEM grid-mounted samples and diced samples.

The assembly 10 may generally comprise a first part 14 having a first holding portion 16, and a second part 18 in engagement with the first part 14 and having a second holding portion 22. The first holding portion 16 and second holding portion 22 are structured such that a microscopy sample 2 can be held or clamped between the first holding portion 16 and the second holding portion 22, such as shown in FIG. 1A.

In the shown embodiment, the assembly 10 further comprises a resilient member 24 positioned to provide a compressive force between the first part 14 and the second part 18. The compressive force is sufficient to safely secure a sample 2, for example, a very thin microscopy sample having a thickness on a micrometer scale, located between the first holding portion 16 and the second holding portion 22.

More specifically, the first holding portion 16 and the second holding portion 22 are structured to mate together such that a sample 2 can be placed and secured between a face 16a of first holding portion 16 and a face 22a of second holding portion 22 (as shown in FIGS. 1B and 2). A compressive force between the first part 14 and the second part 18 is provided by the resilient member 24, and is sufficient to hold a microscopy sample in place, for example, between faces 16a and 22a, without causing damage to the sample 2. In this specific embodiment, the resilient member 24 comprises a coiled spring 26 which at least partially circumscribes the first part 14 and the second part 18 when the first and second parts 14, 18 are in engagement with one another. In order to facilitate placement and removal of a sample from the assembly 10, the assembly further comprises an adjustment mechanism 30. The adjustment mechanism 30 is operable, for example manually operable, to cause the first and second holding portions 16, 22 to separate or be drawn apart from one another (such as shown in FIG. 1B), for example, upon rotation of the adjustment mechanism 30. As shown in FIG. 2, the adjustment mechanism 30 may comprise a rotatable element 32 including a head 32a and elongated threaded portion 32b extending through the first and second parts 14, 18. Adjustment mechanism 30 is operable to force surfaces 22a and 16a apart while the resilient member 24 provides an opposing compressive force. By using a suitable tool received in cavity 34, element 32 can be rotated to cause the first part 14 and the second part 18 to be drawn apart from one another, for example, from the closed position shown in FIG. 1A to the open position shown in 1B.

Advantageously, adjustment mechanism 30 may be structured to prevent the chance of overtightening of the first and second parts 14, 18 against a sample located between faces 16a and 22a. The cooperative action between resilient member 24 and element 32 provides a great degree of control to a user of the assembly 10 and substantially prevents overtightening and resultant breakage of delicate samples.

The assembly 10 may further comprise a mounting element 36 (not visible in FIG. 1B) operable to secure the first part 14 and the second part 18 to a microscopy instrument, a storage container, or the like. The mounting element 36 may be configured as a standard mounting pin. For example, in the shown embodiment, the mounting element 36 comprises a ⅛-inch stem 38.

The assembly 10 may further comprise structure effective to retain positioning of the resilient member 24. For example, the resilient member 24 may be confined to a groove 42 defined in the first and second parts 14, 18. Linking element 43 provides means for securing opposing ends 26a and 26b of the spring 26 as shown. Pins 44 and conforming apertures (not shown) may be provided for maintaining alignment and/or engagement of the first and second parts 14, 18.

The first holding portion 16 and second holding portion 22 of the assembly 10 may be specially fashioned or configured for specific applications. For example, the sample 2 may be a material specimen mounted to a substrate, for example a TEM grid, such as shown in FIGS. 1A and 1B. Such grids and the techniques used to mount specimens thereto are well known to those of skill in the art and thus will not be described in great detail herein.

As shown, the first part 14 and second part 18 include major surfaces 14a and 16a respectfully, above which the sample 2 extends or projects. First holding portion 16 may be defined in part by a recessed region 50 of first part 14. The recessed region 50 may include a shelf region 16c capable of accommodating a microscopy sample in a substantially upright position for observation, characterization or processing with a microscopy instrument. Turning briefly to FIG. 2B, the shelf region 16c comprises spaced apart opposing shelves 16c structured to accommodate opposing edge portions of a microscopy sample, for example, a diced sample 4.

The recessed region 50 may alternatively or additionally include a contoured, for example, curved, for example, concave surface portion 16b. In the shown embodiment, the contoured surface portion 16b extends between opposing shelves 16c. Advantageously, contoured surface portion 16b may have a radius corresponding to a radius of a TEM grid, for example, a standard, commercially available TEM grid. For example, the surface portion 16b has a radius of about 1.5 mm.

Turning back to FIG. 2, the second holding portion 22 may include an extended region 22b having a curved, for example, convex surface 54 having substantially the same radius as surface portion 16b. An FIB-prepared sample on a 3 mm TEM grid can therefore be placed vertically in the recessed region 50 with lower edge of the TEM grid in contact with surface portion 16b. As shown in FIG. 1A, the assembly 10 securely holds the TEM grid mounted sample 2 in a substantially upright, or vertical, position.

Figure 2A:
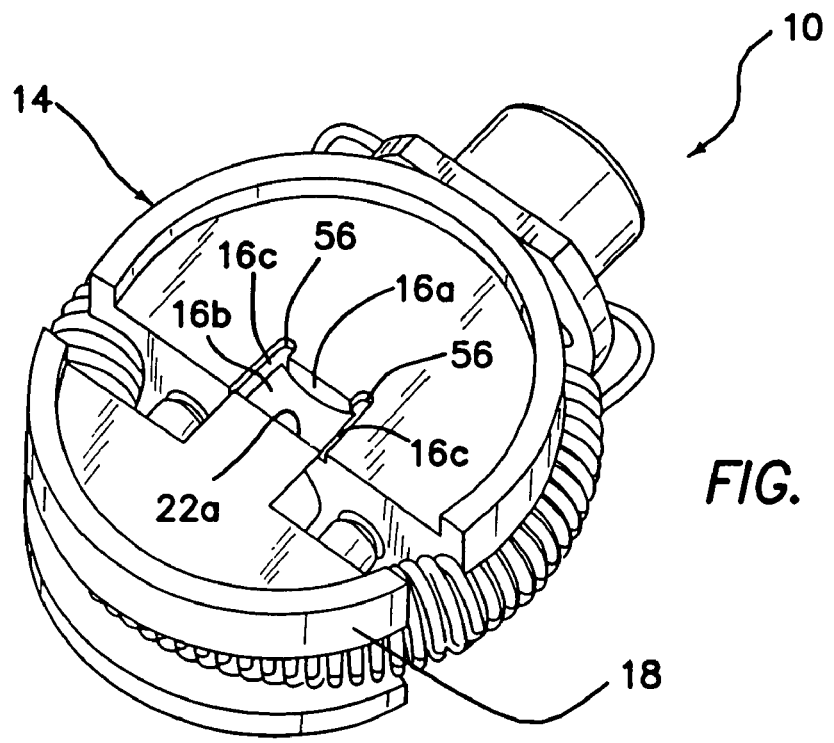
FIG. 2A is another perspective view of the assembly similar to the view shown in FIG. 1B, with the sample removed from the assembly.
Figure 2B:
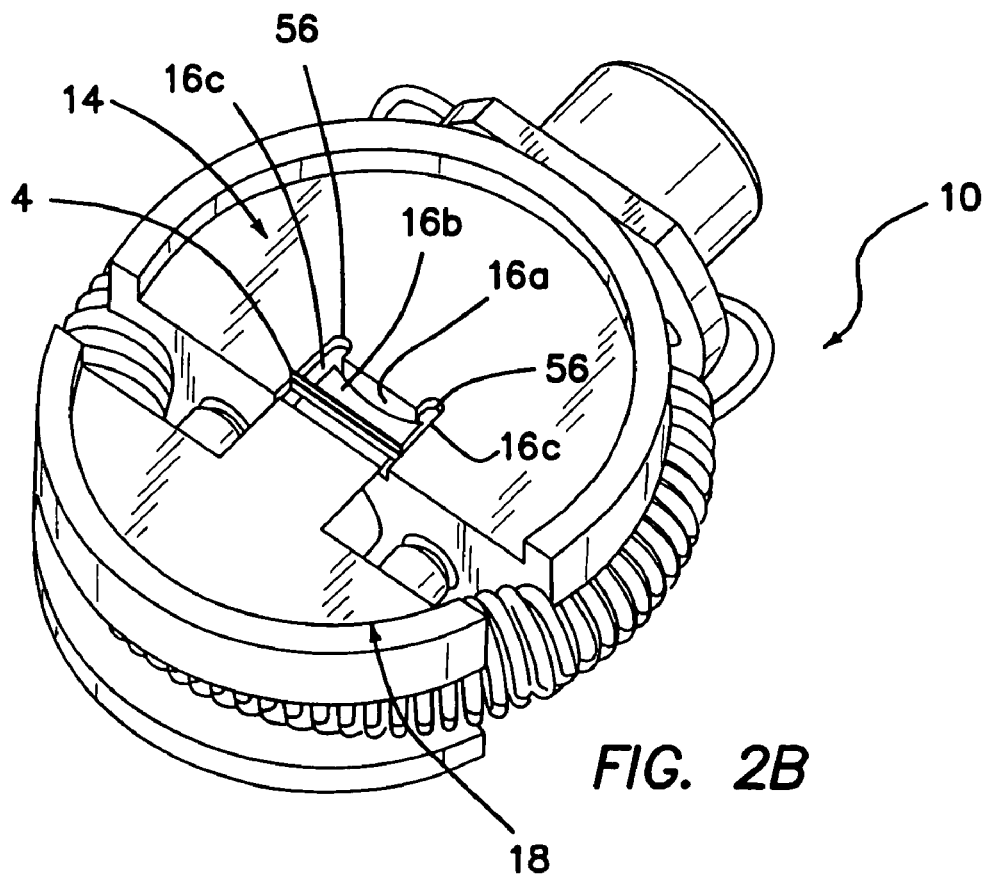
FIG. 2B is a perspective view of the assembly similar to the view shown in FIGS. 1B and 2A, with a different type of sample located in the assembly.

Referring now to FIG. 2A, for purposes of clarity, the assembly 10 is shown without a sample located therein. In one aspect of the invention, the assembly may be structured to be effective to hold more than one type of microscopy sample, for example, at least two different types of microscopy samples. In addition to holding TEM grids, the assembly 10 may also be structured to accommodate thin, diced samples. The assembly 10 may be used to hold many different shapes of thin samples compressed between faces 16a and 22a.

Further, the recess 50 of the first holding portion 16 may includes structure, for example, opposing shelves 16c, structured to accommodate a sample. For example, as shown in FIG. 2B, the sample may be a diced sample 4. Other suitable microscopy samples that can be held in assembly 10, including diced samples, will be known to those of skill in the art and thus will not be described in great detail herein. When positioned in the assembly 10, sample is in contact with opposing shelves 16c. One or more indents 56 are provided for facilitating placement and removal of the sample 4 from the assembly 10. For example, a tool such as tweezers or the like may be inserted into the clearance formed by the indents 56 in order grasp an edge of the sample 4.

In another advantageous aspect of the invention, the assembly 10 may be structured to protect an exposed portion of a sample secured in the assembly 10. For example, referring back now to FIG. 1A, at least one of the first holding portion 16 and the second holding portion 22 preferably includes a projection, for example a projecting region 60, for example, a wall 62, that projects above major surfaces 14a and 18a. Wall 62 substantially circumscribes the exposed portion of the sample 2 when the sample 2 is held in assembly 10. The projecting region 60 preferably projects at a height greater than the height of the sample 2 held in the assembly 10. For example, the wall 62 has a height, for example a substantially uniform height, of about 0.02 inches to about 0.05 inches, for example, about 0.034 inches, when measured from major surfaces 14a and 18a. With this protective wall 62, if the assembly 10 holding a sample is dropped, the wall 62 may provide protection for preventing breakage of the sample 2.

Figure 3:
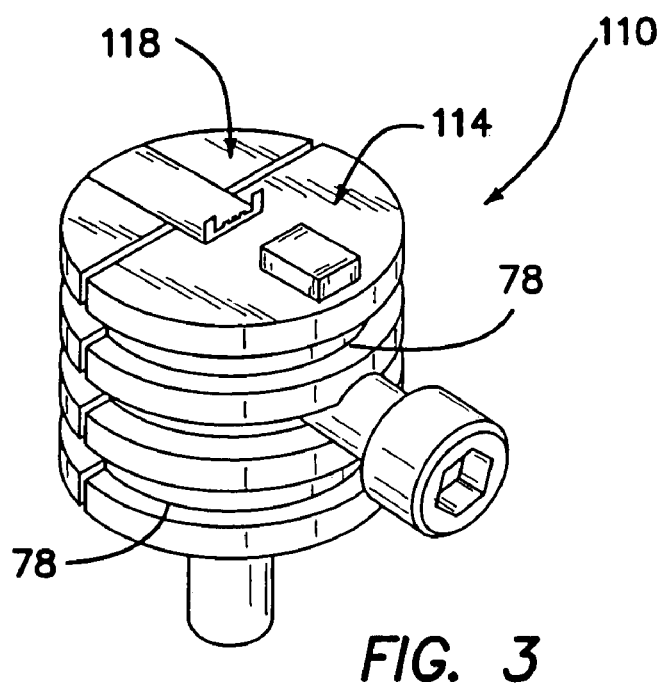
FIG. 3 is a perspective view of another embodiment of the invention.

Turning now to FIG. 3, another embodiment of the invention is shown generally at 110. Except as expressly described herein, assembly 110 is similar to assembly 10 and features of assembly 110 which correspond to features of assembly 10 are designated by the corresponding reference numerals increased by 100.

A primary difference between assembly 110 and assembly is that the compressive force for holding a sample is provided by a plurality of elastomeric bands, or O-rings 78 rather than the single coiled spring 26. The elastomeric o-rings 78 substantially entirely circumscribe the first part 114 and the second part 118 when the first and second parts are in engagement with one another. Further, another distinction shown is that assembly 110 does not include a projecting region 60.

Figure 4:
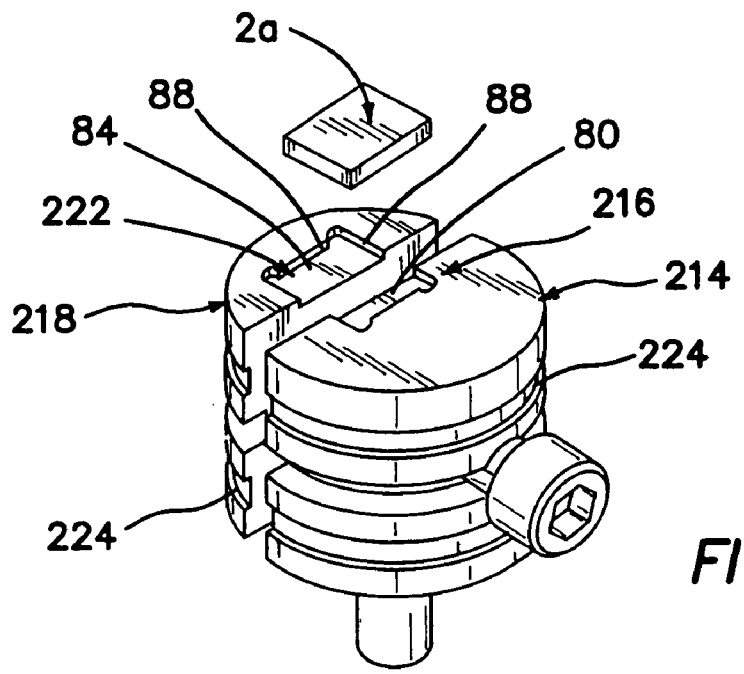
FIGS. 4-7 are perspective views of various other embodiments of the invention.

FIG. 4 shows yet another embodiment of the invention, generally at 210. Except as expressly described herein, assembly 210 is similar to assembly 10 and 110 and features of assembly 210 which correspond to features of assembly 10 are designated by the corresponding reference numerals increased by 200.

Assembly 210 is substantially the same as assembly 110, with a primary difference being the structure used to secure a sample to the assembly 210. In assembly 210, the first holding portion 216 and the second holding portion 222 comprise a recessed region 80 defined in the first part 214 and the second part 218, respectively, shaped to hold a substantially conforming sample 2a. Sample 2a may be a cut, cleaved, or cored sample that matches the recessed area geometry such as shown. The sample 2a can be positioned into the recessed region 80 and then held securely between surfaces 88 by compression of resilient members 224, for SEM or FIB observation. In this embodiment, although not usually necessary, adhesive pads or conductive paint could be used to provide additional security between the sample 2a and the assembly 210.

Figure 5:
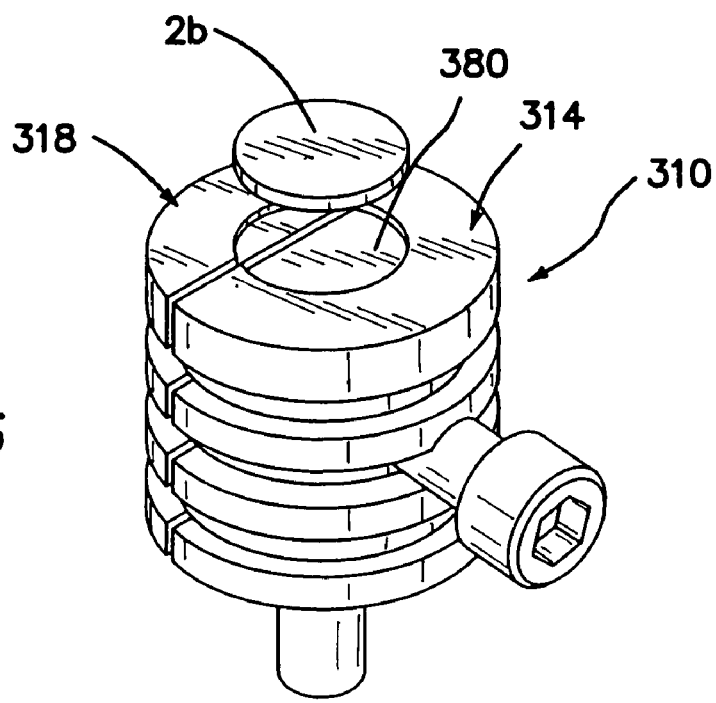

Another embodiment of the assembly of the invention is shown generally at 310 in FIG. 5. Except as expressly described herein, assembly 310 is similar to assembly 10, 110 and 210 and features of assembly 310 which correspond to features of assembly 10 are designated by the corresponding reference numerals increased by 300.

Assembly 310 is similar to assembly 210, with the primary difference being that the recessed region defined in the first and second parts 314, 318, is a circular recessed region 380 rather than a rectangular recessed region. Assembly 310 is thus especially suitable for holding a circular-shaped sample 2b having the same diameter of recessed region 380.

Figure 6:
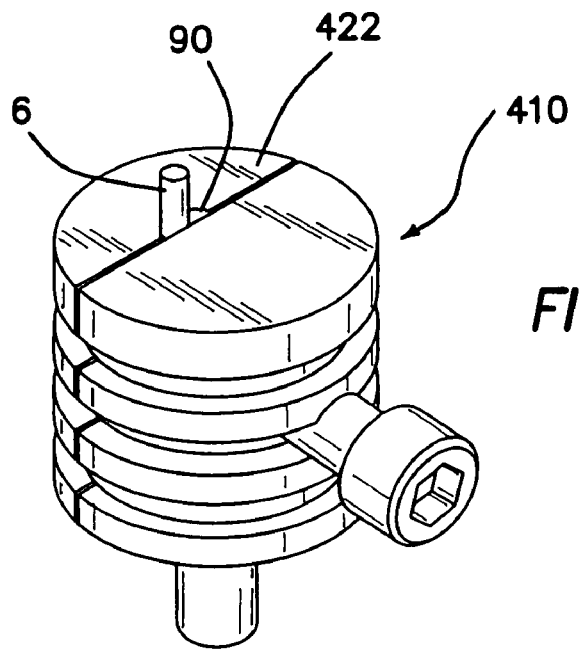

Another embodiment of the assembly of the invention is shown generally at 410 in FIG. 6. Except as expressly described herein, assembly 410 is similar to assembly 10, 110 and 210 and 310 and features of assembly 410 which correspond to features of assembly 10 are designated by the corresponding reference numerals increased by 400.

Assembly 410 is similar to assembly 10, with a primary difference being that a second holding portion 422 includes a notch, for example, a V-shaped notch 90, machined into a face of the second part 418 for accommodating samples such as one or more fiber optic strands 6 in a position for facilitating observation.

Figure 7:
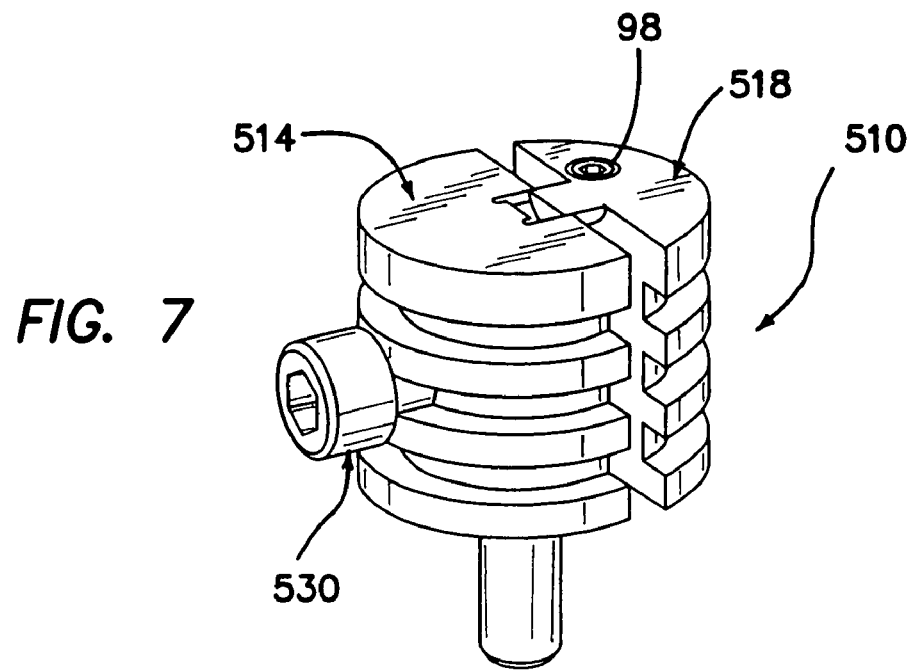
Figure 7A:
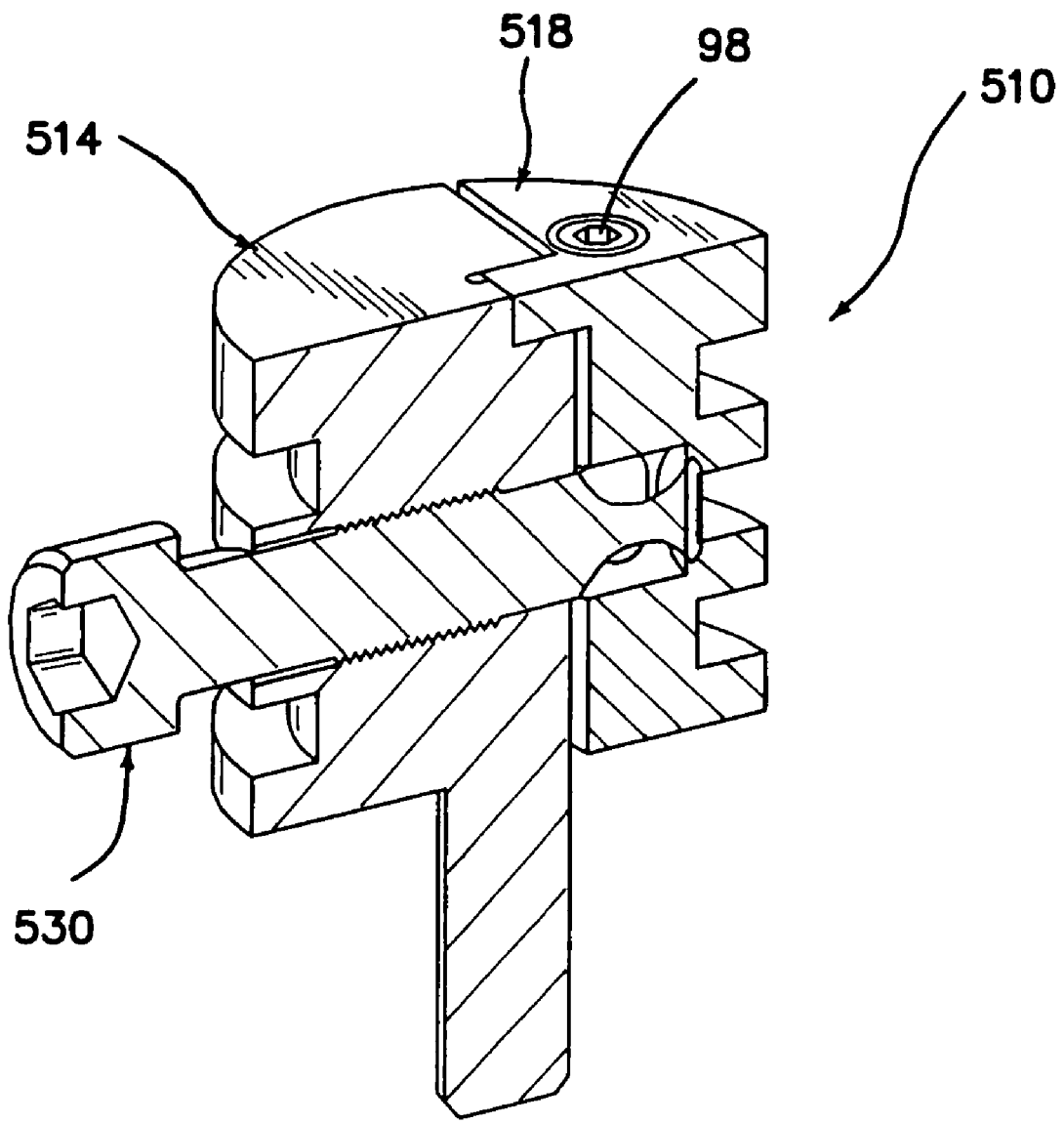
FIG. 7A is a cross sectional view of the embodiment of the invention shown in FIG. 7.

FIGS. 7 and 7A shows another embodiment of the invention generally at 510, which includes a retained-screw clamping mechanism instead of a resilient member 24 to hold the first part 514 and second part 518 in engagement. Rotatable screw 530 is held captive by means of retaining member 98. The rotatable screw 96 is used to draw the first part 514 and the second part 518 together and apart.

Figure 8:
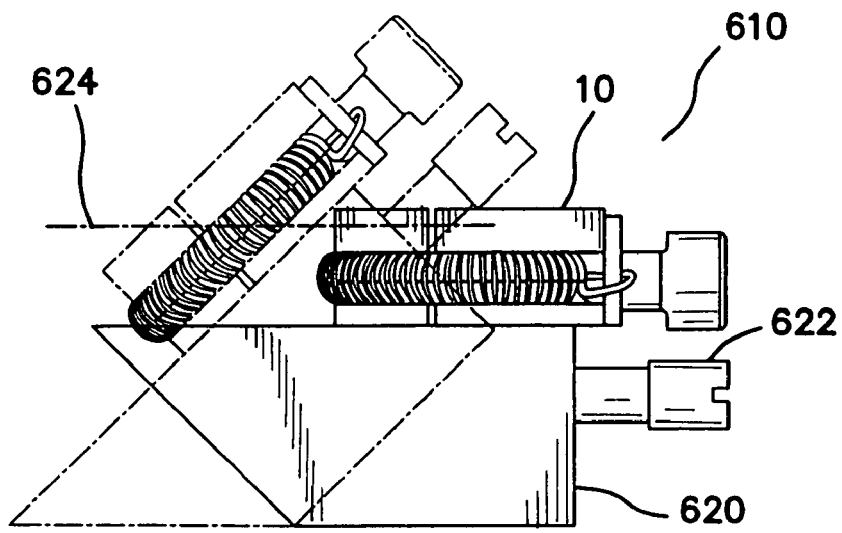
FIG. 8 is a side view of another embodiment of the invention, wherein the assembly includes a removable base element capable of maintaining eucentric height of a sample.

Turning now to FIG. 8, another embodiment of the invention is shown. In this embodiment, assembly 610 includes a sample holder, for example, such as assembly 10 described elsewhere herein, and base member 620 removably couplable to the holder 10 at mounting element (not visible in this view). The base member 620 is structured so as to maintain a eucentric position of a sample (not shown) held in the assembly 10 when the assembly 10 is moved between a first position (shown in solid line) and a second, tilted position (shown in dashed lines). More specifically, when a sample is held in the assembly 10, it is sometimes convenient to observe the position of the sample therein prior to observing the sample using the SEM or TEM instrument. Due to the microscopic thinness of some microscopy samples, it is sometimes necessary to tilt the assembly 10 to confirm the location of the sample or to confirm the correct positioning of the sample, for example, during initial observations using a stereoscope. For example, the base member 620 provides a convenient means for viewing the sample at two different angles without need to readjust the focus of the stereoscope. Preferably, when base member 620 and holder 10 are joined, the center of mass of the combined assembly 610 is located such that the assembly 610 is stable in the two tilt positions. As shown at phantom line 624, a sample disposed in the assembly 610 remains at a eucentric height when the assembly is moved or tilted from the first position to the second position, when the assembly 610 is placed on a horizontal surface. Pin 622 is provided for facilitating storage of the assembly in a storage container (see FIG. 9).

Figure 9:
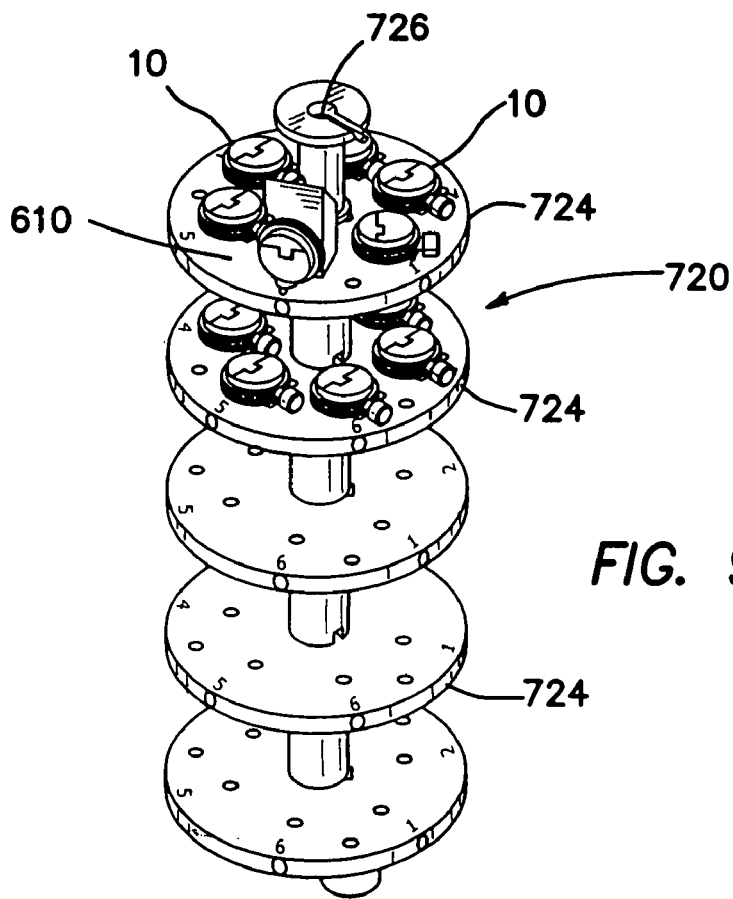
FIG. 9 shows a plurality of assemblies in accordance with the invention, the assemblies being stored in a storage device.

FIG. 9 shows a plurality of assemblies 10, 610 in accordance with the invention, the assemblies being stored in a storage device, for example, a storage tree 720 having multiple levels 724 each capable of holding a plurality of the assemblies 10, 610. As shown, assembly 610 (which includes base member 620) takes up the same amount of space as the assembly 10. Pin 726 is useful for securing the assemblies to the storage tree 720. Walck, U.S. patent application Ser. No. 11/495,294, filed on Jul. 28, 2006, discloses an especially advantageous storage system useful with the assemblies of the present invention, the entire disclosure of which is incorporated herein by this reference.

It will be appreciated by those of skill in the art that many of the present assemblies described and shown herein provide substantial advantages over prior devices and methods for holding and storing microscopy samples. For example, many of the present assemblies can be used to position thin, whole or cut TEM grids or TEM disks in an orientation such that either an in-situ of an ex-situ FIB lift-out technique can be used to attach an FIB-prepared sample. Other types of samples include but are not limited to tripod polished samples, and samples prepared by the small angle cleavage technique. Further, many assemblies and their held samples can be stored in a standard storage container.

Each and every feature and combination of two or more features described herein is included within the scope of the present invention provided that the features included in the combination are not mutually inconsistent.

Although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. An assembly for holding microscopy material samples, the assembly comprising:
   a first part having a first holding portion;
   a second part in engagement with the first part and having a second holding portion, wherein said engaged first and second parts form a structure having a common periphery;
   a resilient member positioned to provide a compressive force between the first part and the second part sufficient to secure a microscopy sample located between the first holding portion and the second holding portion, said resilient member extending about said common periphery and thus surrounding a substantial portion of both said first part and said second part; and
   a mounting element operable to secure the first part and the second part to a microscopy instrument.

2. The assembly of claim 1 wherein the resilient member comprises a spring.

3. The assembly of claim 1 wherein the resilient member comprises an elastomeric member.

4. The assembly of claim 1 wherein the first holding portion includes a recess having a contoured surface portion corresponding to a contoured surface of a TEM grid.

5. The assembly of claim 1 wherein the first holding portion includes a recess having a contoured surface portion corresponding to a radius of a TEM grid.

6. The assembly of claim 1 wherein the first holding portion includes a recess including surface portion having a radius of about 3 mm.

7. The assembly of claim 1 wherein the first holding portion includes a recess having a surface portion structured to accommodate a TEM grid-mounted sample and a shelving portion structured to accommodate a different type of sample.

8. The assembly of claim 1 wherein the first holding portion and the second holding portion are structured to hold a TEM grid mounted sample.

9. The assembly of claim 1 and further comprising a projecting region structured to protect an exposed portion of a sample secured between the first holding portion and the second holding portion.

10. The assembly of claim 1 and further including a base member removably couplable to the mounting element, the base element structured so as to maintain a substantially constant height from a support surface of a sample held in the assembly when the assembly is moved between two different positions.

11. An assembly for holding microscopy samples, the assembly comprising:
   a sample holder including a first part and a second part cooperatively engaged with the first part;
   a mechanism for providing compression between the first part and the second part in order to secure a material sample positioned therebetween;
   the sample holder having structure which has surfaces contoured to accommodate a TEM grid-mounted sample and at least one other different configuration of sample for observation with an instrument; and
   a mounting element operable to secure the sample holder to a microscopy instrument.

12. The assembly of claim 11 wherein the first holding portion includes a recess having a contoured surface portion corresponding to a contoured surface of a TEM grid.

13. The assembly of claim 11 wherein the first holding portion includes a recess including surface portion having a radius of about 3 mm.

14. The assembly of claim 11 and further comprising a projecting region structured to protect an exposed portion of a sample secured between the first holding portion and the second holding portion.

15. The assembly of claim 14, wherein said projecting region comprises a wall.

16. The assembly of claim 11 and further including a base member removably couplable to the mounting element, the base element structured so as to maintain a substantially constant height from a support surface of a sample held in the assembly when the assembly is moved between two different positions.

17. An assembly for holding microscopy samples, the assembly comprising:
   a sample holder including a first part and a second part cooperatively engaged with the first part;
   a mechanism for providing compression between the first part and the second part in order to secure a material sample positioned therebetween, the mechanism substantially surrounding the first and second parts to apply a compressive force inwardly on both of said parts;
   a mounting element operable to secure the sample holder to a microscopy instrument; and
   a base member removably couplable to the mounting element, the base member being structured so as to maintain a substantially constant height from a support surface of a sample held in the assembly when the assembly is moved between two different positions.

18. The assembly of claim 17 wherein the mechanism for providing compression comprises an elastomeric member.

19. An assembly for holding microscopy samples, the assembly comprising:

a sample holder including a first part and a second part cooperatively engaged with the first part, each of the first and second parts including a surface oriented in a first direction for engaging a portion of a microscopy sample, and the first part further including a shelf region having a surface oriented in a second different direction, the sample holder being capable of accommodating a microscopy sample in a substantially upright position for observation, characterization or processing with a microscopy instrument;

a mechanism for providing compression between the first part and the second part in order to secure a microscopy sample positioned therebetween; and a mounting element operable to secure the sample holder to a microscopy instrument.

20. The assembly of claim 19, said shelf region comprising spaced apart opposing shelves structured to accommodate opposing edge portions of a microscopy sample.

* * * * *

UNITED STATES PATENT AND TRADEMARK OFFICE
CERTIFICATE OF CORRECTION

PATENT NO. : 7,759,656 B1 Page 1 of 1
APPLICATION NO. : 11/712830
DATED : July 20, 2010
INVENTOR(S) : Walck et al.

It is certified that error appears in the above-identified patent and that said Letters Patent is hereby corrected as shown below:

Title page, the Title, Item (54);
"DUAL AIR PARTICLE SAMPLE CASSETTE AND METHODS FOR USING SAME" should read;
--REUSABLE HOLDER FOR TRANSMISSION ELECTRON MICROSCOPE, SCANNING ELECTRON MICROSCOPE, AND FOCUSED ION BEAM SAMPLES--

Column 7, line 49; "assembly 110 and assembly is" should read; --assembly 110 and assembly 10 is--

Signed and Sealed this

Fourteenth Day of September, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,759,656 B1 | Page 1 of 1 |
| APPLICATION NO. | : 11/712830 | |
| DATED | : July 20, 2010 | |
| INVENTOR(S) | : Walck et al. | |

It is certified that error appears in the above-identified patent and that said Letters Patent is hereby corrected as shown below:

Title page, the Title, Item (54) and at Column 1, lines 1 and 2;
"DUAL AIR PARTICLE SAMPLE CASSETTE AND METHODS FOR USING SAME" should read;
--REUSABLE HOLDER FOR TRANSMISSION ELECTRON MICROSCOPE, SCANNING ELECTRON MICROSCOPE, AND FOCUSED ION BEAM SAMPLES--

Column 7, line 49; "assembly 110 and assembly is" should read; --assembly 110 and assembly 10 is--

This certificate supersedes the Certificate of Correction issued September 14, 2010.

Signed and Sealed this

Second Day of November, 2010

David J. Kappos
*Director of the United States Patent and Trademark Office*